(12) United States Patent
Murakami et al.

(10) Patent No.: US 6,506,292 B2
(45) Date of Patent: Jan. 14, 2003

(54) FILM FORMING APPARATUS

(75) Inventors: Hiroshi Murakami, Kyoto (JP); Takashi Mikami, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/968,016

(22) Filed: Oct. 2, 2001

(65) Prior Publication Data

US 2002/0074226 A1 Jun. 20, 2002

(30) Foreign Application Priority Data

Oct. 3, 2000 (JP) ........................................ 2000-303266

(51) Int. Cl.$^7$ ............................................... C23C 14/32
(52) U.S. Cl. ........................... 204/298.41; 204/192.38; 118/723 VE
(58) Field of Search ...................... 204/192.38, 298.41; 118/723 VE

(56) References Cited

U.S. PATENT DOCUMENTS

| | | | |
|---|---|---|---|
| 5,080,774 A | * | 1/1992 | Heitzer .................. 204/298.11 |
| 5,279,723 A | | 1/1994 | Falabella et al. ...... 204/192.38 |
| 5,480,527 A | | 1/1996 | Welty .................... 204/192.38 |
| 6,026,763 A | | 2/2000 | Kim et al. ............ 118/723 HC |
| 6,031,239 A | * | 2/2000 | Shi et al. ............... 250/492.21 |

OTHER PUBLICATIONS

Publication "Transport of Plasma Streams in Curvilinear Plasma–Optics System" *Sov. J. Plasma Phys. 4(4), Jul.–Aug. 1978*.

* cited by examiner

*Primary Examiner*—Rodney G. McDonald
(74) *Attorney, Agent, or Firm*—Finnegan, Henderson, Farabow, Garrett & Dunner LLP

(57) ABSTRACT

The vacuum arc evaporation apparatus removes coarse particles from plasma containing cathode materials generated from a cathode 7 provided to a evaporation source 6 by a vacuum arc discharge, and is provided with a porous member 10 on the inside wall of a plasma duct equipped with means for forming deflection magnetic field having a magnetic coil 8 outside thereof so as to guide the plasma in the vicinity of a substrate 11 accommodated in the film forming chamber 1.

18 Claims, 2 Drawing Sheets

FILM FORMING APPARATUS

BACKGROUND OF THE INVENTION

1. Field of the Invention

The present invention relates to a film forming apparatus for improving properties such as wear resistance, anti-seizing property, sliding property and others of mechanical parts, automotive parts, tools and the like.

2. Description of the Related Art

There is a method for forming a thin film on a surface of a substrate by drawing ions contained in a plasma generated by a vacuum arc evaporation source toward the substrate under negative bias voltage of the like. The vacuum arc evaporation source evaporates a cathode by vacuum arc discharge to thereby generate the plasma containing a cathode material. The method is also called a vacuum arc evaporation method. This method has advantageous features of high film forming rate and high adhesion property.

The cathode material evaporated from the cathode of the vacuum arc evaporation source contains fine particles preferable for the film-forming, and coarse particles (also called macro-particles or droplets) whose diameter is several $\mu$m or larger. These coarse particles come flying and adhere to the substrate, causing problems of decreasing the film-adhesion to the substrate or smoothness of the resultant film surface.

For conquering this problem, various methods and devices have been proposed. One of them is an apparatus which guides plasma generated by an arc discharge through line of magnetic force to the substrate, and separates and reduces coarse particles concurrently generated. A typical example is described in J. Plasma Phys. 4(1978), 425 to 428 by I. I. Aksenov. This apparatus is composed of communicating a vacuum arc evaporation source, a curved transport duct (plasma duct), and a film forming chamber. The curved transport duct has outside thereof a magnetic field-forming device for guiding the plasma generated in the vacuum arc evaporation source to the substrate having thereby removed coarse particles. The film forming chamber has the substrate accommodated therein.

There have recently been proposed improved apparatus which guides only ions in plasma generated in the evaporation source by use of the magnetic field to the substrate. As one of examples, explanation will be made to a film forming apparatus described in JP-W-10-505633.

A film forming apparatus shown in FIG. 2 comprises a target 33, a contact electrode 35, a plasma duct 39, a first electromagnet 46, a second electromagnet 48, and a third electromagnet 50. On the target 33, materials evaporated by the arc discharge are generated. The contact electrode 35 contacts to the target 33 under a condition where negative voltage is impressed to the target 33. The plasma duct 39 is bent almost perpendicularly. The first electromagnet 46 is disposed at an outside of the portion of the plasma duct 39, where the target 33 is provided. The second electromagnet 48 is disposed at a bending portion of the plasma duct 39. The third electromagnet 50 is disposed at an exit portion of the plasma duct 39 to surround the plasma duct 39. The plasma duct 39 is provided at the inside wall with baffles 52 extending toward the inside.

If the contact electrode 35 contacts the target 33 under a condition where negative voltage is impressed to the target 33, an arc is generated instantaneously. This arc evaporates the target while staying on the surface of the target 33 for a predetermined time to generate the plasma containing a target material.

At this time, when a current is impressed the first, second and third electromagnets 46, 48, 50, line of magnetic force 40 is distributed following the plasma duct 39. Accordingly, in plasmas containing the target material generated by the target 33, a charged particle (ion) advances following the line of magnetic force (deflection magnetic field) 40, and is sent from an exit of the plasma duct 39 into a film forming chamber (not shown), and evaporated to a substrate (not shown) located in the chamber. Non-ionized neutral particles and coarse particles do not reach the substrate but adhere to the plasma duct 39 and the baffles 52 disposed on the inside wall of the plasma duct 39.

Therefore, major parts of coarse particles are, as advancing within the plasma duct 39, removed by adhering to the inside wall of the plasma duct 39 and the baffles 52.

U.S. Pat. No. 5,279,723 and Japanese Patent Unexamined Publication No. Hei. 10-280135 disclose similar devices, each of which is provided, for catching coarse particles, with the baffles, which is composed of a metal ring like member or a vane like member extending toward the inside from the inside wall of the plasma duct, on the inside wall of the bent or curved plasma duct.

However, problems as mentioned under are involved with the structure of the baffles located on the inside wall of the conventional plasma duct.

Firstly, as mentioned above, each of the baffles is composed of the metal ring like member or the vane like member extending toward the inside from the inside wall of the plasma duct. Therefore, when coarse particles come flying to parts facing vertically to the plasma duct, they adheres thereto or are reflected in the cathode direction, and when those come flying to a parallel face to the plasma duct, they are reflected with high possibility in the direction of the substrate.

If many ring or vane like members are provided for repulsing much coarse particles in the target direction, there are inevitably many faces parallel to the plasma duct as mentioned above. Therefore, the number of coarse particle reflected in the direction of the substrate increases, so that the possibility of coarse particles reaching the substrate is high to obstruct the smoothness and adhesion of the film.

Secondly, for securing many ring or vane like members to the inside wall of the plasma duct, screwing or welding are necessary. Therefore, it takes much processing time and fixture time therefor with high production cost. In case operating for a long time, the baffles should be exchanged for being dirty, and much time is taken for exchanging lots of baffles.

Thirdly, in the baffle structure as mentioned above, large and small neutral particles adhere to the inside wall of the plasma duct. Therefore, a dirt removing work is demanded when exchanging the baffles, and a maintenance is not easy.

Other than the problems concerning coarse particles, though being fine particles preferable to the film-forming, some of them do not cover the substrate but adhere to the inside wall of the film forming chamber, and problems occur as under.

In the above mentioned apparatus, the structure of the inside wall of the film forming chamber accommodating the substrate is not described. Therefore, if the inside wall is the same material as that composing the film forming chamber, fine particles once adhered to the inside wall drop and mix into the film to probably deteriorate a film quality.

SUMMARY OF THE INVENTION

This invention has been established to settle the above described problems. Accordingly, it is an object of the invention to provide a film forming apparatus which forms on a substrate a film being mixed with little coarse or fine particles, and excellent in smoothness, adhesion and quality, and which is good at operating performance such as maintenance of low cost.

The above mentioned object can be achieved by a film forming apparatus according to the invention, comprising: a vacuum arc evaporation source, a film forming chamber, and a curved plasma duct. The vacuum arc evaporation source generates plasma containing cathode materials by evaporating a cathode through vacuum arc discharge. The film forming chamber accommodates a substrate therein and is vacuum-evacuated. The curved plasma duct has outside thereof a deflection magnetic field forming unit for guiding the plasma generated in the vacuum arc evaporation source in the vicinity of the substrate having removed coarse particles by the curved plasma duct. In the film forming apparatus, the plasma duct has a porous member on the inside wall thereof. Further, the film forming chamber has a porous member on the inside wall thereof.

According to the film forming apparatus of the invention, the plasma duct has the porous member with a large absorbing surface on the inside wall thereof. Accordingly, coarse particles fly-coming are easily caught because going into pores of the porous member and has a good adhesion with the porous member, thereby preventing the reflection toward the substrate and mixture of coarse particles into the film. If the porous member is also arranged on the inside wall of the film forming chamber, fine particles adhered thereto are not easy to drop, and can be restrained from mixing into the film during film-forming.

Herein, the porous member for catching coarse particles may be composed of felt like or mesh like members. The felt-like member is meant by a member made by compressing a line-like member into a cotton-like member, and the mesh-like member is woven into network.

In particular, if plural sheets of the mesh-like members are laminated, the catching effect of coarse particles is heightened.

The porous member may be also composed of non-woven, metal or non-metal porous substances. The non-woven fabric is desirably a heat resistant material durable to high temperatures of 200° C. or higher if possible. The porous member may be also composed of material including the cathode materials. Because, a material quality containing the cathode materials has a better adaptation to coarse and fine particles and has a stronger adhesion than a material quality not containing the cathode materials, particles catching ability is heightened. Even in the case of not containing the cathode materials, similar effects are available by covering a material in advance containing an element of the cathode materials by an ordinary plating or evaporation.

DETAILED DESCRIPTION OF THE PREFERRED EMBODIMENT

Figure 1:
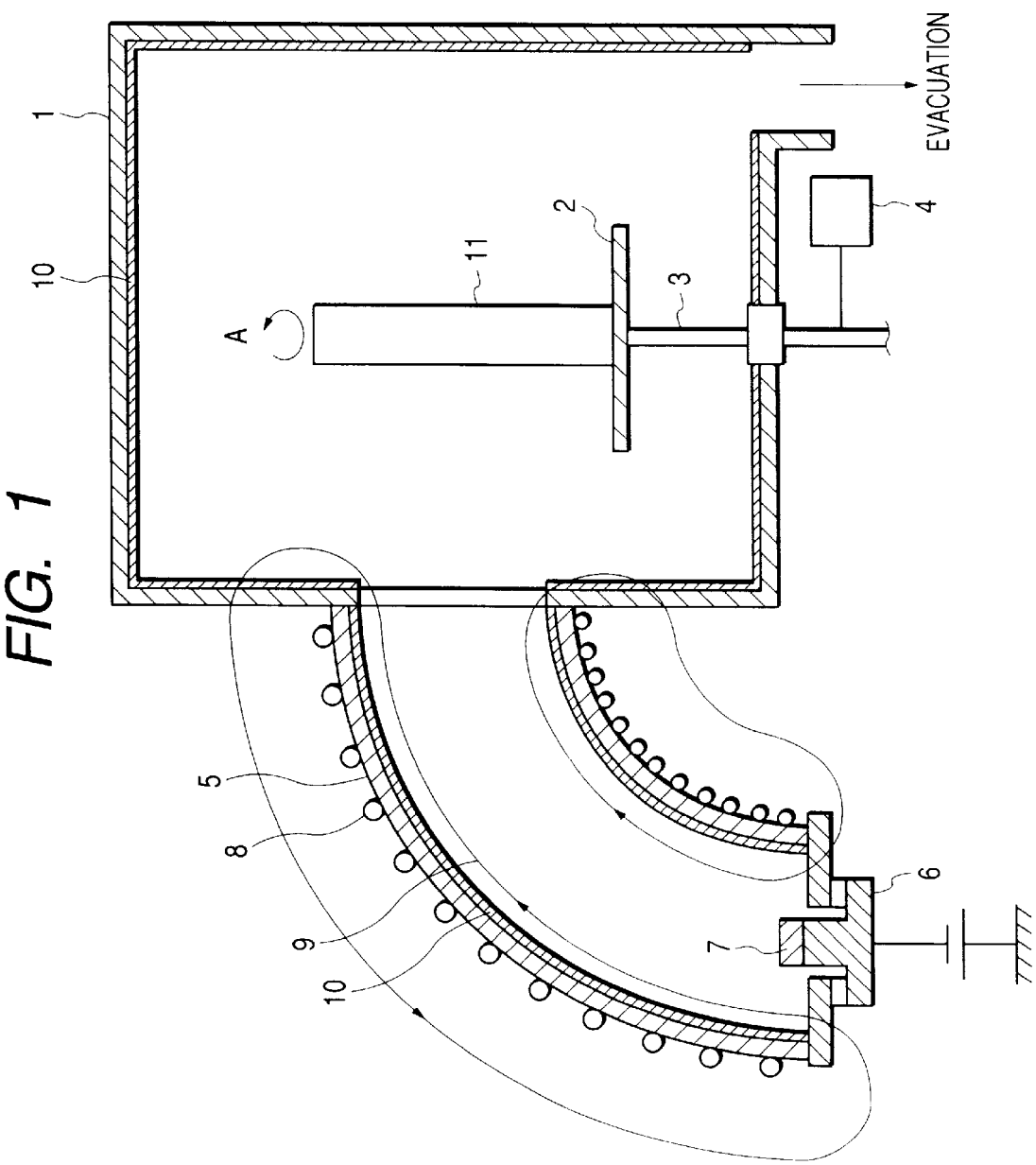
FIG. 1 is a schematically cross sectional view showing an vacuum arc evaporation apparatus according to the invention.
Figure 2:
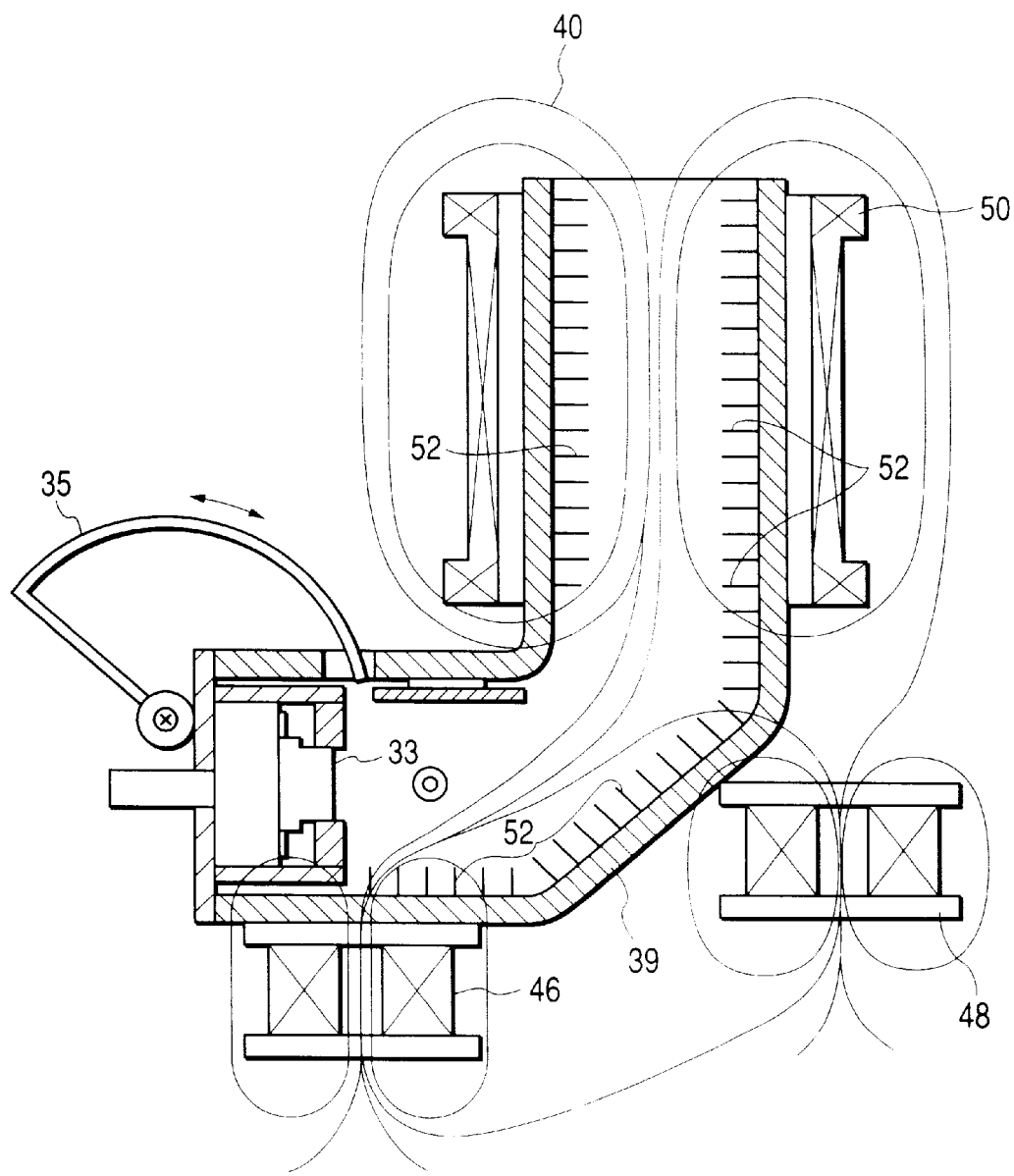
FIG. 2 is a cross sectional view showing one example of a conventional vacuum arc plasma transport apparatus.

FIG. 1 is a schematically cross sectional view showing one example of the vacuum arc evaporation apparatus according to the invention.

The vacuum arc evaporation apparatus has a film forming chamber 1 which is vacuum-evacuated by a vacuum-evacuating device (not shown). In the film forming chamber 1, a holder 2 is provided for holding a substrate 11 to be film-formed. The film forming chamber 1 and a later mentioned plasma duct 5 connected thereto are electrically grounded in this example. The holder 2 is supported by a support shaft 3, and rotated in an A direction by a driving part (not shown).

In the film forming chamber 1, as requested, a gas as an inert gas or a reactive gas is introduced. The inert gas is, for example, an argon gas. The reacting gas is such a gas reacting with the cathode materials generated from the vacuum arc evaporation source to produce a compound substance, for example, a nitrogen gas.

The holder 2 and the substrate 11 held thereby are, in this example, impressed with negative bias voltage of, e.g., around-several +V to −1000V from a bias electric source 4. In case a film to be formed or the substrate is electrically insulating substances, positive or negative pulse voltage or high frequency voltage are sometimes impressed.

At an opening part in the wall face of the film forming chamber 1, the curved plasma duct 5 is connected such that one-side end of the plasma duct 5 faces to the substrate 11 on the holder 2. The interior of this plasma duct 5 is vacuum-evacuated together with the film forming chamber 1.

To another end of the plasma duct 5, a vacuum arc evaporation source 6 is connected. The vacuum arc evaporation source 6 has a cathode (target) 7, and partially fuses the cathode 7 to evaporate cathode materials by the vacuum arc discharge between the cathode and the plasma duct 5 serving as an anode in this example.

The cathode 7 of the vacuum arc evaporation source 6 is composed of a desired material (for example a pure metal, alloy, or carbon) in response to kinds of films to be formed. More specifically, it is composed of pure metals, e.g., Ti, Cr, Mo, Ta, W, Al or Cu, alloys as TiAl, or a graphite (carbon).

Around the outer circumference of the plasma duct 5, there is provided means for forming deflection magnetic filed. The deflection magnetic filed forming means forms a magnetic field which is curved following the plasma duct 5, and guides the plasma generated in the vacuum arc evaporation source 6 by said magnetic field in the vicinity of the substrate 11 on the holder 2 within the film forming chamber 1. The magnetic coil 8 is excited by DC exciting source (not shown). A part of the line of magnetic force 9 generated by exciting the magnetic coil 8 is schematically shown in FIG. 1, following the inside face of the plasma duct 5.

The magnetic coil 8 used as the magnetic field forming means is solenoid in the present embodiment, and instead of this, a plurality of toridal coils may be disposed on the outer circumference of the plasma duct, otherwise a permanent magnet is sufficient.

The porous member 10 is disposed on the inside wall of the plasma duct 5. Further, in this embodiment, also on the inside wall of the film forming chamber 1, the porous member 10 is provided.

Coarse particles of the cathode materials come flying from the cathode 7 into the plasma duct 5 by the vacuum arc discharge, and adhere to and are caught by the porous member 10. The porous member 10 is porous, and has a large adhering surface area. Accordingly, the adhering ability is high, and once caught coarse particles do not so much reflect toward the substrate 11.

Thus, according to the inventive apparatus, plasma having removed coarse particles can be guided in the vicinity of the substrate along the line of magnetic force.

As the porous member 10 is for catching coarse particles, it is desirable that the absorbing surface area is large, and a pore diameter is larger than that of coarse particle, and since it is disposed on the inside wall of the plasma duct, materials of good processability. Actually, there are enumerated such porous bodies of felt-like, mesh-like, non-woven, metal or non metal substances. In particular, since the felt-like, mesh-like, non-woven porous member have elasticity other than the above mentioned characteristics, and absorb kinetic energy of coarse particles fly-coming, they are effective in decreasing reflecting energy and most preferable.

The porous member 10 is also sufficient with such materials, after catching the coarse particles fly-coming, having good adaptation between both and good adhesion. Accordingly, the porous member 10 may be composed of a material containing the cathode materials to be evaporated by the vacuum arc discharge or a material containing the cathode materials and covered with a plating or evaporation.

For example, when the vacuum arc evaporation source 6 is attached with the cathode 7 of graphite and the substrate 11 is formed with a carbon film by evaporating the cathode, the porous member 10 may be a carbon containing felt material (carbon felt), a porous carbon material (carbon form) or a carbon mesh material (carbon line materials are stitched together in network). In case the porous member 10 is other than carbon, it is useful to previously apply a carbon coating to the porous member 10.

The porous member may be attached as one body or in division to the inside wall of the plasma duct. Attaching can be easily made by screwing both ends of the porous member, and therefore, maintenance as exchanging is simply performed.

When the porous member is attached in division to the inside wall of the plasma duct, the plural kinds of porous members may be employed.

In the example of FIG. 1, the porous member 10 is also disposed on the inside wall of the film forming chamber 1. In this case, fine particles adhered to the inside wall neither drop to the substrate 11 nor mix into the film, so that it is possible to form films of good quality having excellent smoothness and adhering property.

Further, in the example of FIG. 1, the porous member is arranged almost all over the inside wall of the plasma duct, and of course the porous member may be arranged at one part of the plasma duct such as parts to which coarse particles frequently come flying, or at a plurality of parts.

As mentioned above, according to the invention, the porous member is disposed on the inside wall of the curved plasma duct, and so it is possible to offer the vacuum arc evaporation apparatus at lower production cost and better in the processability as the maintenance than the baffles of the existing plasma duct.

As coarse particles generated by the vacuum arc discharge can be securely caught, and plasma having removed coarse particles can be guided nearly the substrate, it is possible to form films of good quality having the surface smoothness and the good adhesion with the substrate.

Besides, disposing the porous member also to the inside wall of the film forming chamber, thereby to prevent fine particles adhered to the inside wall of the film forming chamber from dropping, adhering to the substrate and mixing into the film, the film of good quality can be formed.

What is claimed is:

1. A film forming apparatus comprising:

a vacuum arc evaporation source for generating plasma containing cathode materials by evaporating a cathode through vacuum arc discharge;

a film forming chamber for accommodating a substrate therein and being vacuum-evacuated; and a curved plasma duct having outside thereof a deflection magnetic field forming unit for guiding said plasma generated in the vacuum arc evaporation source in the vicinity of the substrate having removed coarse particles by the curved plasma duct, wherein the plasma duct has a porous member on an inside wall thereof.

2. The film forming apparatus according to claim 1, wherein the film forming chamber has a porous member on an inside walls thereof.

3. The film forming apparatus according to claim 1, wherein the porous member is a felt member.

4. The film forming apparatus according to claim 2, wherein the porous member is a felt member.

5. The film forming apparatus according to claim 1, wherein the porous member is at least one mesh member.

6. The film forming apparatus according to claim 2, wherein the porous member is at least one mesh member.

7. The film forming apparatus according to claim 1, wherein the porous member is a non-woven fabric.

8. The film forming apparatus according to claim 2, wherein the porous member is a non-woven fabric.

9. The film forming apparatus according to claim 1, wherein the porous member is a metal or a nonmetal porous member.

10. The film forming apparatus according to claim 2, wherein the porous member is a metal or a nonmetal porous member.

11. The film forming apparatus according to claim 1, wherein the porous member is composed of a material containing the cathode materials.

12. The film forming apparatus according to claim 2, wherein the porous member is composed of a material containing the cathode materials.

13. The film forming apparatus according to claim 1, wherein the porous member is composed of a member which is covered with the material containing the cathode materials.

14. The film forming apparatus according to claim 2, wherein the porous member is composed of a member which is covered with the material containing the cathode materials.

15. The film forming apparatus according to claim 5, wherein the mesh members are laminated.

16. The film forming apparatus according to claim 6, wherein the mesh members are laminated.

17. The film forming apparatus according to claim 1, wherein the porous member is arranged almost all over the inside wall of the plasma duct.

18. The film forming apparatus according to claim 1, wherein the porous member is arranged at one part of the plasma duct such as parts to which coarse particles frequently come flying, or at a plurality of parts.

* * * * *